United States Patent
Wall, Jr.

(10) Patent No.: US 7,952,112 B2
(45) Date of Patent: May 31, 2011

(54) RGB THERMAL ISOLATION SUBSTRATE

(75) Inventor: Franklin J. Wall, Jr., Vacaville, CA (US)

(73) Assignee: Philips Lumileds Lighting Company LLC, San Jose, CA (US)

( * ) Notice: Subject to any disclaimer, the term of this patent is extended or adjusted under 35 U.S.C. 154(b) by 800 days.

(21) Appl. No.: 11/118,898

(22) Filed: Apr. 29, 2005

(65) Prior Publication Data
US 2006/0243986 A1 Nov. 2, 2006

(51) Int. Cl.
*H01L 23/12* (2006.01)

(52) U.S. Cl. ............ 257/99; 257/93; 257/700; 257/725; 257/E23.11

(58) Field of Classification Search .......... 257/698–703, 257/723–725, 778, 99
See application file for complete search history.

(56) References Cited

U.S. PATENT DOCUMENTS

| | | | |
|---|---|---|---|
| 4,845,405 A | 7/1989 | Yamane et al. | |
| 5,233,204 A | 8/1993 | Fletcher et al. | |
| 6,229,160 B1 | 5/2001 | Krames et al. | |
| 6,274,399 B1 | 8/2001 | Kern et al. | |
| 6,547,249 B2 | 4/2003 | Collins, III et al. | |
| 6,614,103 B1 * | 9/2003 | Durocher et al. | 257/678 |
| 6,649,440 B1 | 11/2003 | Krames et al. | |
| 2004/0012958 A1 * | 1/2004 | Hashimoto et al. | 362/241 |
| 2004/0184272 A1 * | 9/2004 | Wright et al. | 362/373 |
| 2006/0012299 A1 * | 1/2006 | Suehiro et al. | 313/512 |

FOREIGN PATENT DOCUMENTS

| | | |
|---|---|---|
| EP | 0864432 A2 | 9/1998 |
| JP | 63226080 A | 9/1988 |
| JP | 06270470 A | 9/1994 |
| JP | 10321909 A | 12/1998 |
| JP | 2002-368279 | * 12/2002 |
| JP | 2002368279 A | 12/2002 |

* cited by examiner

*Primary Examiner* — Wael M Fahmy
*Assistant Examiner* — Abul Kalam

(57) ABSTRACT

A submount for red, green, and blue LEDs is described where the submount has thermally isolated trenches and/or holes in the submount so that the high heat generated by the green/blue AlInGaN LEDs is not conducted to the red AlInGaP LEDs. The submount contains conductors to interconnect the LEDs in a variety of configurations. In one embodiment, the AlInGaP LEDs are recessed in the submount so all LEDs have the same light exit plane. The submount may be used for LEDs generating other colors, such as yellow, amber, orange, and cyan.

19 Claims, 5 Drawing Sheets

RGB THERMAL ISOLATION SUBSTRATE

FIELD OF THE INVENTION

This invention relates to light emitting diodes (LEDs) and, in particular, to a mounting substrate for thermally isolating multicolored LEDs of different types.

BACKGROUND

It is known to mount red, green, and blue LED dies on a single submount to create a white light module. The submount is a thermally conductive and electrically insulating substrate (e.g., ceramic) with conductors formed on it that lead from the LED contacts to two or more leads or solder contact pads. The conductors typically interconnect at least some of the LEDs in series and/or parallel. The submount is then typically mounted on a printed circuit board having connectors leading to a power source and/or to other submounts. The heat generated by each die is transferred to the submount and ultimately to a heat sink (e.g., the circuit board) thermally coupled to the submount. Since the entire submount is substantially at the same temperature, an LED generating a relatively low heat compared to the other LEDs will be heated by the other LEDs. For example, the heat generated by a red LED may be less than the heat generated by a blue LED since less current needs to flow through the red LED to produce the desired light output.

Red and amber LEDs are typically formed using AlInGaP eptiaxial layers, while green and blue LEDs are typically formed using AlInGaN epitaxial layers. The light output of AlInGaP LEDs is very temperature sensitive (higher temperature=lower output) and much more sensitive than the light output of AlInGaN LEDs. Thus, the overall color (e.g., white point) of the RGB module will change with temperature. This is particularly undesirable when the module is used in a color display or for a flat panel display backlight. Further, excessive heating of an AlInGaP LED reduces its useful life.

Additionally, red LEDs are typically thicker than blue LEDs due to the red LEDs typically having a thick window layer. Therefore, the red LEDs sit up higher on the common submount, resulting the red and green/blue LEDs having different light output exit planes. This causes a variation in the overall color output of the module.

To avoid the above heating problems, the RGB LEDs may be mounted on separate submounts, but this results in additional costs, a larger area for the RGB module, voltage drops across the extra wiring, and other drawbacks.

SUMMARY

A submount for red, green, and blue LEDs is described where the submount has thermally isolated trenches and/or holes in the submount so that the high heat generated by the green/blue AlInGaN LEDs is not conducted to the heat sensitive red/amber AlInGaP LEDs. The submount contains conductors to interconnect the LEDs in a variety of configurations.

In one embodiment, the AlInGaP LEDs are recessed in the submount so all LEDs have the same light exit plane.

The submount may be used for LEDs generating other colors, such as yellow, amber, orange, and cyan.

DETAILED DESCRIPTION

Figure 1:
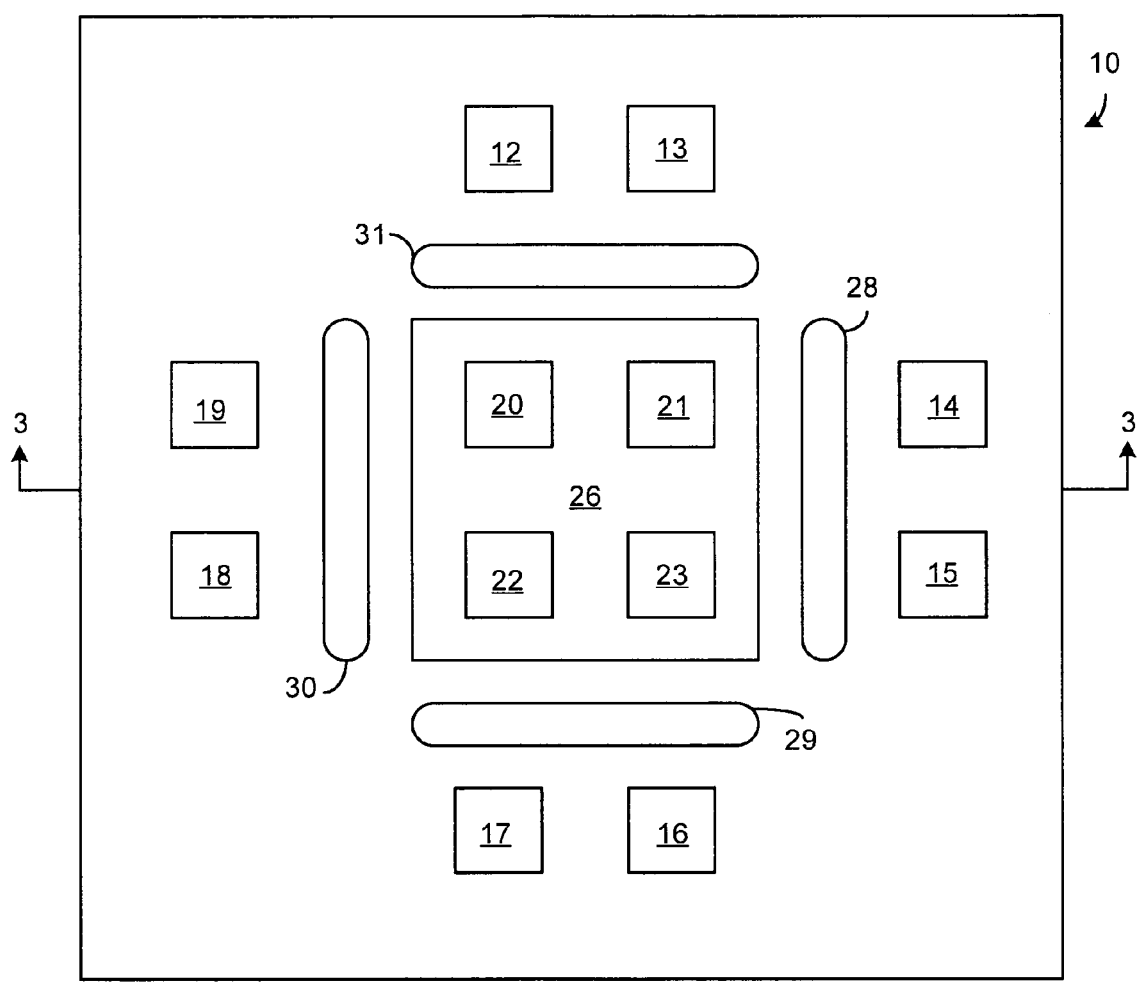
FIG. 1 is a top down view of an RGB LED submount showing LED positions, a central recessed portion for the AlInGaP LEDs, and thermal-isolation trenches in the submount.

As a preliminary matter, conventional LEDs of different types and colors are formed. In the example used, one type of LED is a GaN-based LED, such as an AlInGaN LED, for producing green, cyan, blue, or UV light. Typically, p and n-type epitaxial GaN layers are grown on a sapphire substrate using conventional techniques. The p-layers are typically the upper layers and are contacted by a metal electrode on the top surface.

Various techniques are used to gain electrical access to the underlying n-layers. In a flip-chip example, portions of the p-layers and active layer are etched away to expose an n-layer for metallization. In this way the p contact and n contact are on the same side of the chip and can be directly electrically attached to the submount contact pads. Current from the n-metal contact initially flows laterally through the n-layer. In contrast, in a vertical injection (non-flip-chip) LED, an n-contact is formed on one side of the chip, and a p-contact is formed on the other side of the chip. Electrical contact to one of the p or n-contacts is typically made with a wire or a metal bridge, and the other contact is directly bonded to a submount contact pad. A flip-chip GaN LED is used in the examples although wire bond GaN LEDs can equally benefit from the invention.

For red, amber, orange, and yellow light, the LEDs are formed using the AlInGaP material system. In an AlInGaP LED, p and n-type epitaxial AlInGaP layers are typically grown on a GaAs substrate, followed by growing or wafer bonding a conductive window layer. The light-absorbing GaAs substrate may be removed. The LEDs may be formed as flip chips or use a wire bond.

The designations of AlInGaN and AlInGaP are used to refer to LEDs with a GaN or GaP base having any Al and In percentage (including zero) to achieve the desired color.

Methods for forming such multicolor LEDs are well known. Some examples of forming LEDs are described in U.S. Pat. Nos. 6,649,440, 6,547,249, 6,274,399, 6,229,160, and 5,233,204, all assigned to Lumileds Lighting and incorporated by reference.

The wafer of LEDs is diced to produce individual LED dies typically on the order of 1 mm$^2$ or less.

For combining different color LEDs (e.g., AlInGaN and AlInGaP LEDs) in a single module to create white light or some other combined color, the LED dies are mounted on a submount 10 described with respect to FIGS. 1-5.

Submount 10 is formed of layers of an electrically insulating material such as a ceramic. In other embodiments, the submount may be silicon, where a layer of oxide provides electrical insulation.

LEDs 12-23 are shown. More or fewer LEDs may be used in other embodiments. Heat sensitive AlInGaP LEDs 20-23 are mounted in a recessed center position 26. LEDs 20-23 typically generate red, orange, amber, or yellow light (i.e., wavelengths greater than 575 nm). LEDs 12-19 are GaN based and typically generate blue, cyan, or green light (i.e., wavelengths less than 575 nm). GaN LEDs are less heat sensitive than AlInGaP LEDs. The eight GaN LEDs will typically generate more heat than the four AlInGaP LEDs since more current may be applied to the GaN LEDs to achieve the desired brightness (GaN LEDs are less efficient than AlInGaP LEDs) and there are more GaN LEDs producing heat.

To substantially thermally isolate the GaN LEDs 12-19 from the AlInGaP LEDs 20-23, trenches 28-31 are formed in submount 10 to cause a discontinuance in a heat-conducting path between the GaN LEDs and the AlInGaP LEDS.

The trenches 28-31 do not completely circumscribe the AlInGaP LEDs in order to maintain structural integrity; however, in other embodiments the trenches completely circumscribe the AlInGaP LEDs.

Figure 2:
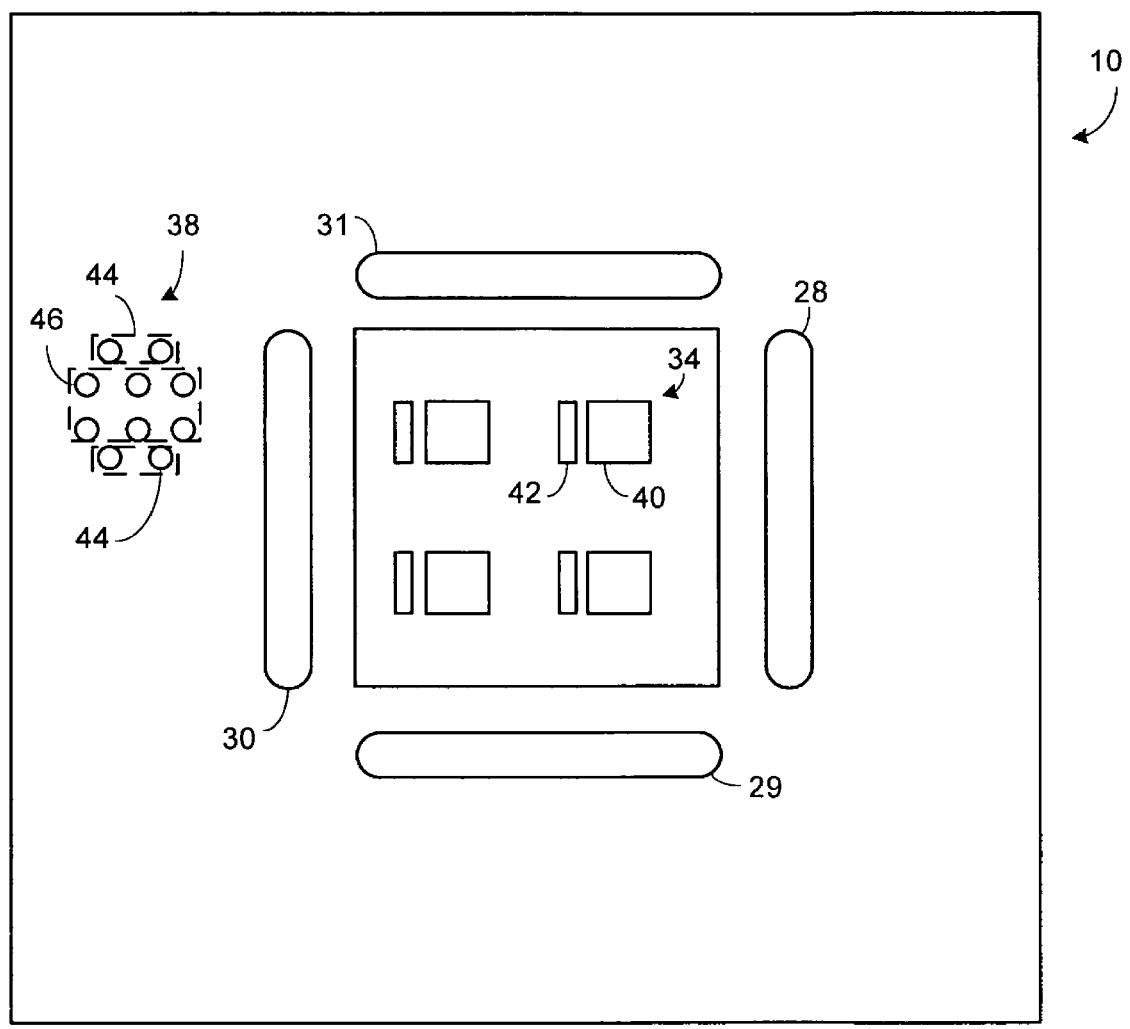
FIG. 2 is a top down view of the submount showing contact pads for some of the LEDs.

FIG. 2 illustrates examples of contact pads 34 for the four AlInGaP LEDs and one set of contact pads 38 for the GaN LEDs. Only one set of GaN LED contact pads 38 is shown for simplicity, and there may be many different contact pad arrangements on submount 10.

In the example, the AlInGaP LEDs are not flip chips and require a wire bond for the top electrode. The contact pads 34 for an AlInGaP LED consist of a metal (e.g., gold) pad 40 for soldering directly to the bottom electrode (e.g., the n-electrode) of the AlInGaP LED and a metal pad 42 for connection of a wire between the top electrode (e.g., the p-electrode) of the AlInGaP LED and pad 42.

The GaN LEDs in this example are flip chips, with both n and p metal electrodes on the bottom of the die. The contact pads 38 for the GaN LEDs consist of a set of n-contacts 44 and a set of p-contacts 46 that align with n and p electrodes on the bottom surface of the LEDs. The contacts are gold in one embodiment. The electrodes are distributed to more uniformly distribute the current through the LED active layer. Flip chips using such distributed n and p electrodes are described in U.S. Pat. No. 6,547,249, assigned to the present assignee.

Figure 3:
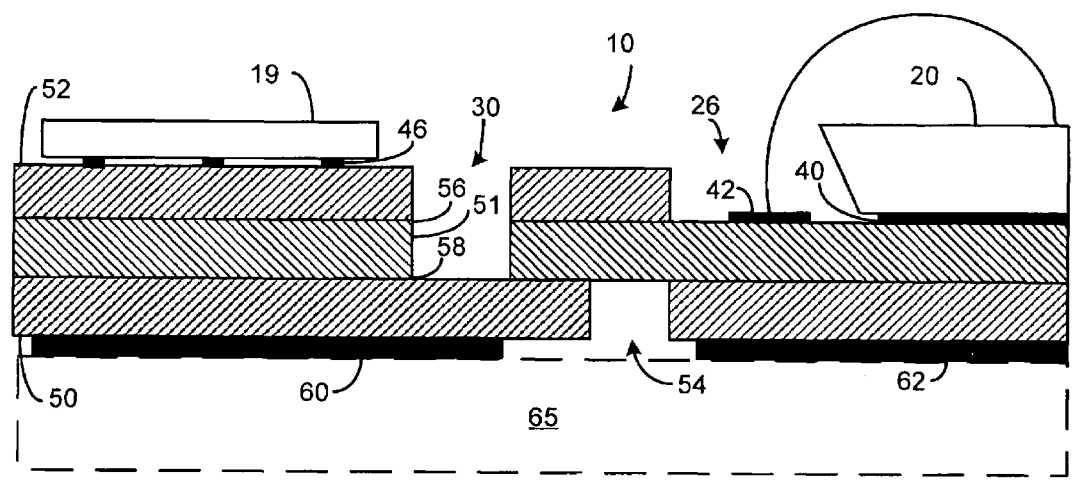
FIG. 3 is a partial cross-sectional view of the submount and LEDs showing the thermal-isolation trenches and holes.

FIG. 3 is a cross-sectional view of a portion of submount 10 along the centerline 3-3 of FIG. 1. The figure is not necessarily drawn to scale in order to better show the significant features. In this example, submount 10 is formed of three ceramic layers 50, 51, 52, with a patterned metal layer 56, 58 between each ceramic layer. The ceramic layers may be formed by molding (ceramic particles in a binder that is cured during molding under pressure). Forming ceramic substrates is well known. The metal layers may be sputtered or otherwise deposited and patterned using an etchant.

A deep trench 30 is formed in the top two layers 51, 52 by the molding process or by an etching process to thermally isolate the layer portions 51, 52 under LED 19 from the layer portion 51 under LED 20. In another embodiment, the trenches are a series of holes for reducing the thermal contact area between one portion of a layer and another portion of the layer.

A pattern of holes 54 (also shown in FIG. 5) in layer 50 substantially surrounds the recessed portion 26 to thermally isolate the layer 50 under LED 19 from the layer 50 under LED 20.

Thus, there are two levels of thermal isolation performed by trenches 28-31 (FIG. 1) and holes 54. If the thermal isolation provided by trenches 28-31 is sufficient, the holes 54 may be deleted.

The metal contacts pads on the surface of submount 10 are electrically connected to the patterned metal layers 56 and 58 between the ceramic layers, which are in turn connected to solder pads (also see FIG. 5) on the bottom of submount 10. In one embodiment, solder pad 60 is electrically coupled to an n or p electrode of LED 19, and the center solder pad 62 is used only for thermal conduction to an underlying heat sink.

Figure 5:
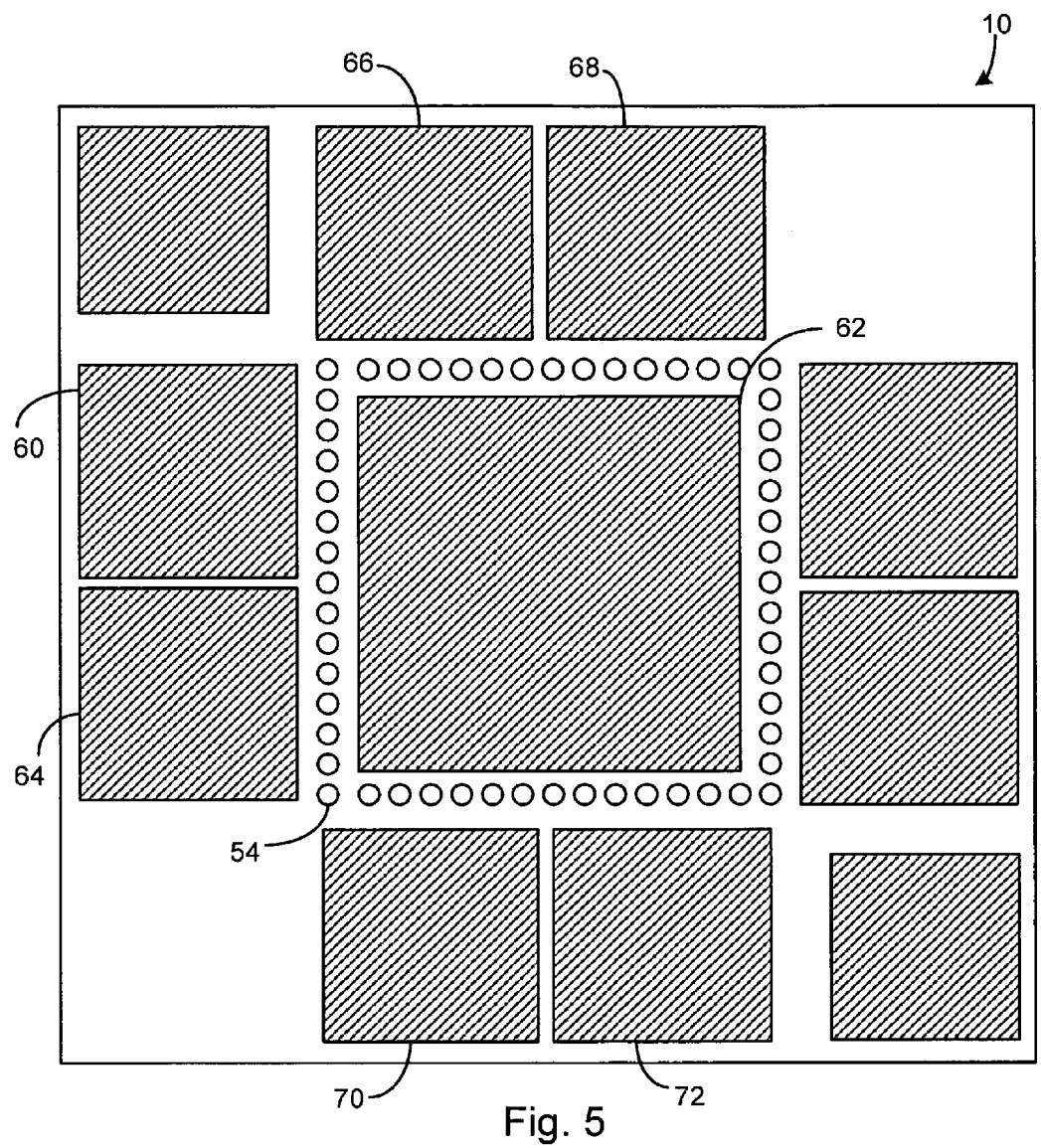
FIG. 5 is a bottom view of the submount showing various solder pads, which may be connected in any configuration to the LED electrodes.

FIG. 5 is a bottom view of submount 10 showing the various solder pads. Many configurations of solder pads are possible and depend on the number and variety of LEDs used.

Figure 4:
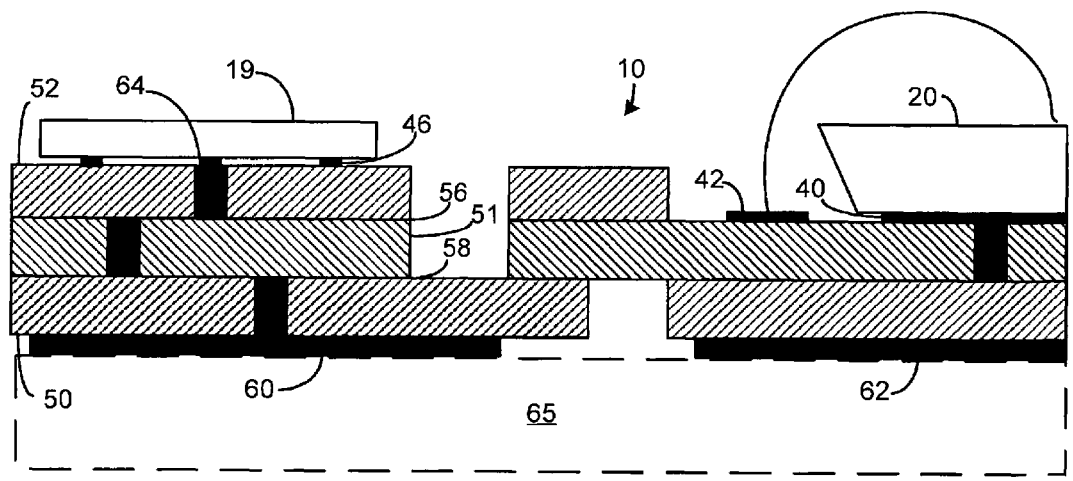
FIG. 4 is a partial cross-sectional view of the submount further showing vias for electrically coupling the LED electrodes to various conductor layers and to the bottom solder pads.

FIG. 4 illustrates possible vias 64 through the various ceramic layers that electrically interconnect the contact pads, metal layers, and solder pads. The via holes may be formed by molding and filled with a metal using sputtering.

The patterning of the metal layers 56, 58 and the locations of the vias 64 determine how the various LEDs are interconnected. In one embodiment, all the green LEDs (e.g., LEDs 14, 15, 18, and 19 in FIG. 1) may be connected in series and connected to the same n and p solder pads 60 and 64 (FIG. 5) on the bottom of submount 10. All the blue LEDs (e.g., LEDs 12, 13, 16, and 17) may be connected in series and connected to the same n and p solder pads 66 and 68. All the AlInGaP LEDs (e.g., LEDs 20-23) may be connected in series and connected to the same n and p solder pads 70 and 72. In another embodiment, groups of LEDs are also connected in parallel. The particular configuration depends on factors such as the desired voltage drop, the required currents, the types of LEDs used, the desired color mix, and other factors.

The central solder pad 62 may be for thermal coupling only to a heat sink or could be a contact for the AlInGaP LEDs.

One or more submounts 10 may be solder-bonded to a printed circuit board 65 (shown in dashed outline), which may contain metal leads for connection to other LED modules and a power supply. The circuit board 65 may interconnect the various LEDs in series and/or parallel. The circuit board 65 may be an aluminum sheet, for heat sinking purposes, with a thin electrical insulating layer on its surface and a metal conductor pattern over the insulating layer. The submount's solder pads bonded to the corresponding pads on the circuit board provide a good thermal path to the aluminum heat sink. The circuit board may be mounted on a larger heat sink.

Instead of the solder pads on the bottom of submount 10, the electrical contacts may be surface mount pads, leads extending from the submount, a plug or socket, castellations, or other provisions for an electrical interface.

Mounting the submount on a circuit board is optional since the submount may be directly connected to a power supply.

In addition to the thermal decoupling provided by submount 10, a recessed area 26 (FIGS. 1 and 3) is provided by etching or molding the top ceramic layer 52. Since the height of the AlInGaP LEDs is larger than the height of the GaN LEDs, in the example shown, the recess 26 causes the tops of the AlInGaP and GaN LEDs to be substantially even after being mounted on submount 10. In this way, the light exit planes of the GaN and AlInGaP LEDs are even, and light emitted from the sides of the GaN LEDs is not blocked by the taller AlInGaP LEDs. This results in a more color-uniform light pattern around the module.

Another benefit of submount 10 is that the AlInGaP LEDs may be bonded to the submount's contact pads 40 (FIG. 2) by solder reflow, while the GaN flip chips may be bonded to the contact pads 38 by stud bumps. The GaN LED gold stud bump electrodes are ultrasonically welded to the gold contact pads using well known techniques. The bottom surfaces of the AlInGaP LEDs have sputtered onto them a eutectic AuSn solder (melting temperature 280 degrees C.). The AlInGaP LEDs are positioned on the gold contact pads 40, and the contact pads 40 are heated to slightly above 280 degrees to reflow the solder and bond the LED electrodes to the contact pads. The GaN LEDs may be bonded to submount 10 before or after the solder reflow since the heating of the central portion of submount 10 will not significantly affect the temperature of the outer portions of submount 10.

In another embodiment, the GaN LEDs are soldered to any configuration of contact pads.

An array of RGB LED groups may be mounted on a single submount. For example, each RGB group may act as an RGB pixel for a display, so the array of RGB groups on a single submount may act as a small color display. Such a submount may be any size. An array of submounts can provide enough pixels for a full display or act as a controllable color light source for illumination.

In one embodiment, the top surface area of the submount is between 6 mm$^2$-4 cm$^2$, depending on the number of LEDs mounted on the submount.

As seen, the inventive submount improves the performance of multicolor LED modules by thermally isolating heat sensitive LEDs from heat-generating LEDs. As a result, the mixed color is more uniform over time. Further, the recessed portion equalizes the light exit plane of all the LEDs.

The position of the recessed portion can be anywhere on the submount. Also, the arrangement of the trenches and holes can be in any suitable pattern. The LEDs that can utilize the submount are not limited to GaP and GaN LEDs.

Figure 6:
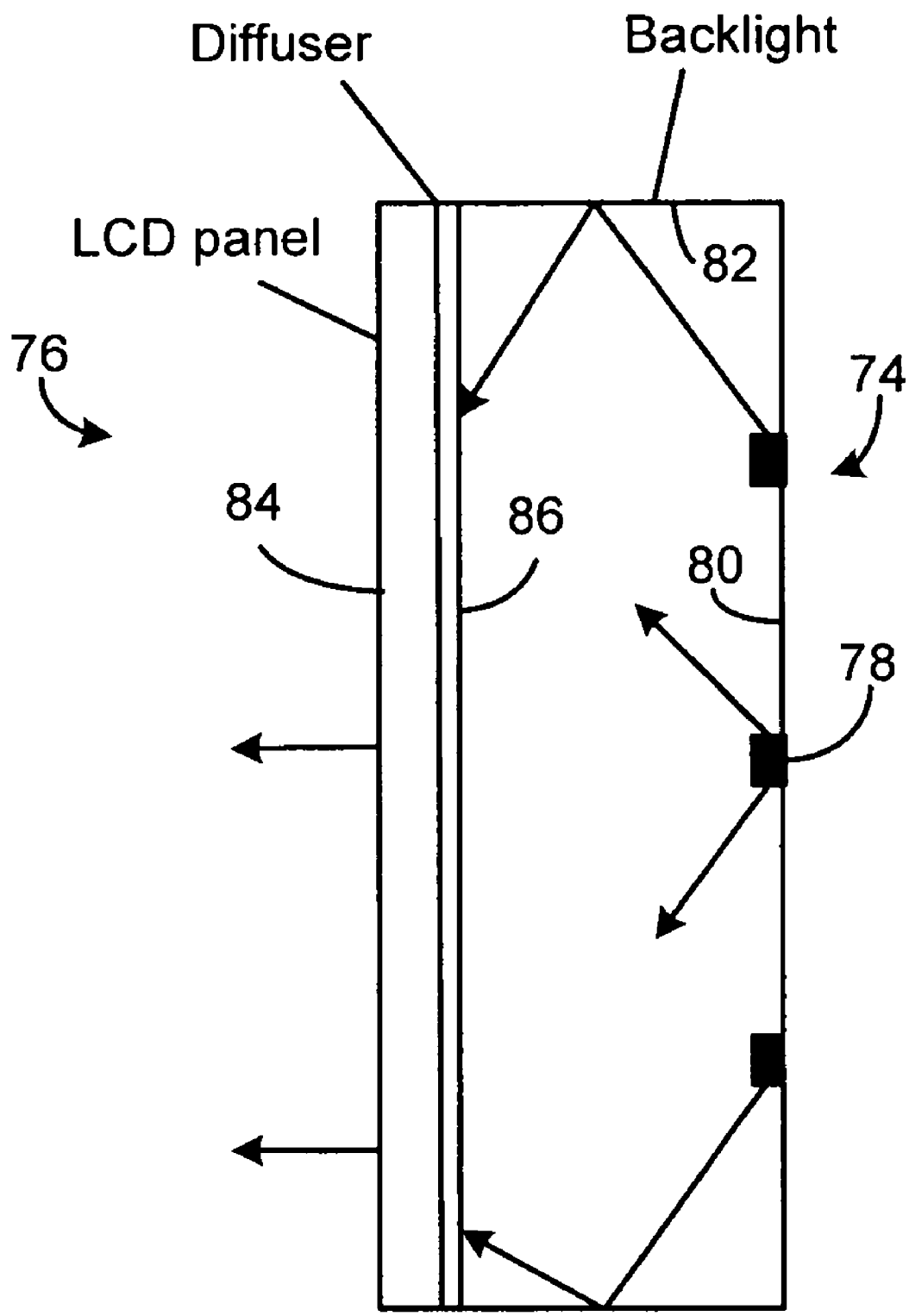
FIG. 6 is a cross-sectional view of a liquid crystal display (LCD) using the RGB LEDs mounted on a submount as a backlight.

The submount 10 with RGB LEDs is particularly useful for creating uniform white light for a display backlight. FIG. 6 is a cross-sectional view of a backlight 74 for a liquid crystal display (LCD) 76 or other display that uses a backlight. Common uses are for televisions, monitors, cellular phones, etc. One or more of the RGB LED submounts 78 described above are mounted on a circuit board 80. The LED submounts 78 may form a two-dimensional array. The bottom and sidewalls 82 of the backlight box are preferably coated with a white reflectively-diffusing material. The light from the various multicolored LEDs is mixed in the box to create a uniform white light. Also shown in FIG. 6 is an LCD screen 84, having controllable RGB pixels (shutters), and a diffuser 86.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. A light emitting diode (LED) structure comprising:
 a first LED die comprising first p-type and first n-type layers, the first LED die having at least a first bottom metal layer;
 a second LED die comprising second p-type and second n-type layers, the second LED die having at least a second bottom metal layer; and
 a submount comprising an electrically insulating body, the insulating body comprising:
   a bottom layer and at least one top surface layer overlying and supported by the bottom layer, the at least one top surface layer having an outer boundary limited to an outer boundary of the bottom layer,
   the at least one top surface layer having at least one top surface, the at least one top surface having formed thereon a first metal pad bonded to the first bottom metal layer of the first LED die, the at least one top surface also having formed thereon a second metal pad bonded to the second bottom metal layer of the second LED die,
   the bottom layer having formed on its bottom surface a third metal pad electrically connected to the first metal pad and a fourth metal pad electrically connected to the second metal pad, the bottom layer underlying the first LED die and the second LED die,
   the at least one top surface layer having a first trench formed in it between the first metal pad and the second metal pad such that the first trench is above the bottom layer,
   the first trench in the at least one top surface layer for increasing thermal isolation between the first LED die and the second LED die, and
   a second trench in the bottom layer not directly beneath the first trench, wherein the second trench is located directly between the third metal pad and the fourth metal pad and extends substantially a length of the third metal pad or fourth metal pad for increasing thermal isolation between the first LED die and the second LED die.

2. The structure of claim 1 wherein there are a plurality of sets of first contact pads and a plurality of sets of second contact pads.

3. The structure of claim 2 further comprising a recessed portion of the submount on which the first contact pads are supported.

4. The structure of claim 2 further comprising a recessed portion of the submount on which the first contact pads are supported, and a non-recessed portion on which the second contact pads are supported, wherein a top surface of the first LED die and a top surface of the second LED die, when mounted on the submount, are in substantially the same plane.

5. The structure of claim 1 wherein there are a plurality of sets of first contact pads and a plurality of sets of second contact pads, the plurality of sets of first contact pads being located in a middle portion of the submount and the plurality of sets of second contact pads being located in an outer portion of the submount, the first trench in the at least one top surface layer being between the plurality of sets of first contact pads and the plurality of sets of second contact pads.

6. The structure of claim 5 wherein the middle portion of the submount is recessed.

7. The structure of claim 1 wherein the first LED die is a GaP based LED die and wherein the second LED die is a GaN based LED die.

8. The structure of claim 1 wherein the submount has a middle portion and an outer portion surrounding the middle portion, wherein the first metal pad is in the middle portion, the second metal pad is in the outer portion, and the first trench is between the middle portion and the outer portion.

9. The structure of claim 1 wherein the second LED die is a flip chip.

10. The structure of claim 1 wherein the at least one top surface layer has a fourth metal pad connected to a first electrode of the first LED die by a wire.

11. The structure of claim 1 wherein the submount further comprises electrical conductors between at least the bottom layer and the at least one top surface layer.

12. The structure of claim 1 wherein the electrical insulating body is a ceramic.

13. The structure of claim 1 wherein the first LED die emits light having a wavelength greater than 575 nm, and the second LED die emits light having a wavelength less than 575 nm.

14. The structure of claim 1 further comprising third contact pads on the first surface for bonding to at least a third LED die, the first LED die emitting light of a first color, the second LED die emitting light of a second color, and the third LED die emitting light of a third color.

15. The structure of claim 14 wherein the first color is red, the second color is blue, and the third color is green.

16. The structure of claim 1 further comprising a printed circuit board on which the submount is mounted.

17. The structure of claim 1 further comprising a reflective enclosure housing the submount, the enclosure forming a backlight for a display.

18. The structure of claim 1 wherein the submount is adapted to be mounted on a circuit board.

19. The structure of claim 1 wherein the second trench is formed by a plurality of holes.

* * * * *